(12) United States Patent
Collins et al.

(10) Patent No.: US 7,273,778 B2
(45) Date of Patent: Sep. 25, 2007

(54) METHOD OF ELECTROPLATING A SUBSTANCE OVER A SEMICONDUCTOR SUBSTRATE

(75) Inventors: Dale W. Collins, Boise, ID (US);
Richard H. Lane, Boise, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/053,781

(22) Filed: Feb. 8, 2005

(65) Prior Publication Data

US 2005/0139481 A1 Jun. 30, 2005

Related U.S. Application Data

(62) Division of application No. 10/199,736, filed on Jul. 18, 2002, now Pat. No. 6,984,301.

(51) Int. Cl.
*H01L 21/8242* (2006.01)
(52) U.S. Cl. ............... 438/239; 438/243; 438/253; 438/254; 438/255; 438/393; 438/396; 438/397; 438/398; 257/E21.011; 257/E21.019
(58) Field of Classification Search ......... 438/243, 438/239, 253–255, 393, 396–398
See application file for complete search history.

(56) References Cited

U.S. PATENT DOCUMENTS

| | | | |
|---|---|---|---|
| 4,638,400 A | 1/1987 | Brown et al. | |
| 6,140,234 A | 10/2000 | Uzoh et al. | |
| 6,171,952 B1 | 1/2001 | Sandhu et al. | |
| 6,197,181 B1 | 3/2001 | Chen | |
| 6,200,433 B1 * | 3/2001 | Ding et al. | 204/192.15 |
| 6,255,187 B1 * | 7/2001 | Horii | 438/396 |

(Continued)

FOREIGN PATENT DOCUMENTS

EP 0 930 647 A1 7/1999

(Continued)

OTHER PUBLICATIONS

PCT/US03/21637; Filed Oct. 2003; Search Report; 10 pp.

(Continued)

*Primary Examiner*—Michael Lebentritt
*Assistant Examiner*—Kyoung Lee
(74) *Attorney, Agent, or Firm*—Wells St. John P.S.

(57) ABSTRACT

The invention includes methods of electrochemically treating semiconductor substrates. The invention includes a method of electroplating a substance. A substrate having defined first and second regions is provided. The first and second regions can be defined by a single mask, and accordingly can be considered to be self-aligned relative to one another. A first electrically conductive material is formed over the first region, and a second electrically conductive material is formed over the second region. The first and second electrically conductive materials are exposed to an electrolytic solution while providing electrical current to the first and second electrically conductive materials. A desired substance is selectively electroplated onto the first electrically conductive material during the exposing of the first and second electrically conductive materials to the electrolytic solution. The invention also includes methods of forming capacitor constructions.

18 Claims, 8 Drawing Sheets

U.S. PATENT DOCUMENTS

| | | |
|---|---|---|
| 6,281,142 B1 | 8/2001 | Basceri et al. |
| 6,291,332 B1 | 9/2001 | Yu et al. |
| 6,326,559 B1 | 12/2001 | Yoshioka et al. |
| 6,355,153 B1 | 3/2002 | Uzoh et al. |
| 6,503,791 B2 | 1/2003 | Matsui et al. |
| 6,703,272 B2 | 3/2004 | Taylor et al. |
| 6,787,460 B2 | 9/2004 | Lee et al. |
| 7,014,749 B2 | 3/2006 | Redepenning |
| 2001/0036746 A1 | 11/2001 | Sato et al. |
| 2001/0055851 A1 | 12/2001 | Horii |
| 2002/0048870 A1 | 4/2002 | Lane |
| 2002/0074584 A1 | 6/2002 | Yang |
| 2002/0192953 A1 | 12/2002 | Wang et al. |
| 2004/0043559 A1 | 3/2004 | Srividya et al. |
| 2004/0266130 A1 | 12/2004 | Wang |

FOREIGN PATENT DOCUMENTS

| | | |
|---|---|---|
| EP | 1 167 585 A2 | 1/2002 |
| JP | 5-243222 | 9/1993 |
| JP | 05243222 A * | 9/1993 |
| JP | 2003-31688 | 1/2003 |

OTHER PUBLICATIONS

WEBSITE: http://www.answers.com/topic/noble-metal, to find general definition of noble metal material, reprinted Jan. 10, 2006, 4 pgs.

WEBSITE: http://en.wikipedia.org/wiki/Electrolysis, to find general process of electrolysis electroplating, reprinted Jan. 10, 2006, 3 pgs.

* cited by examiner

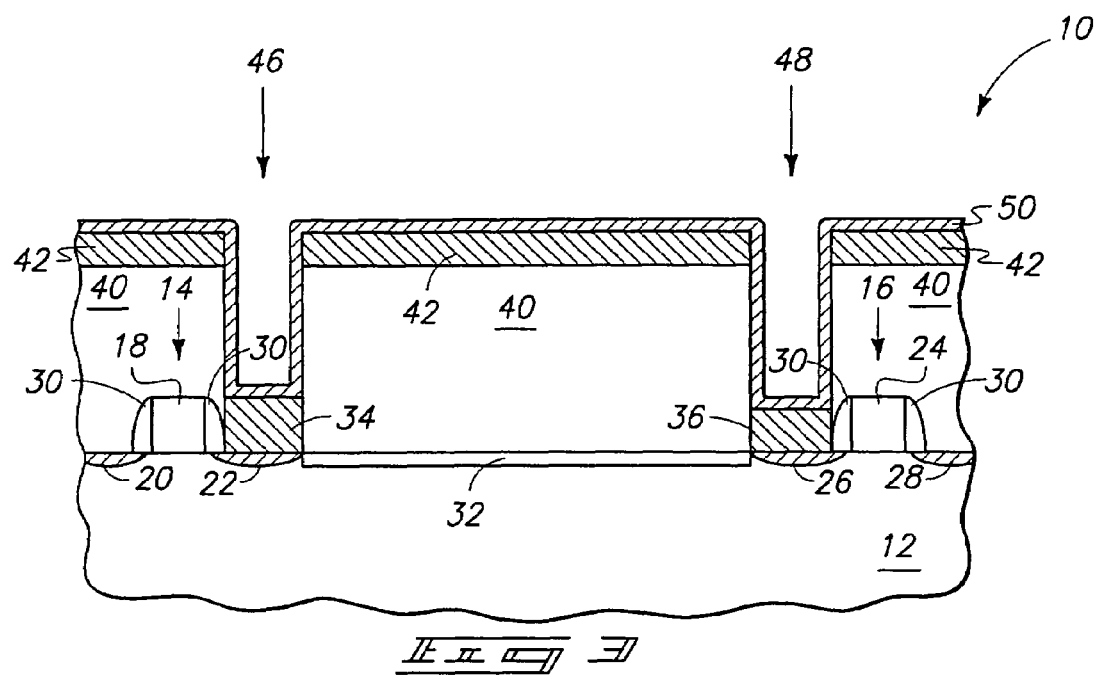
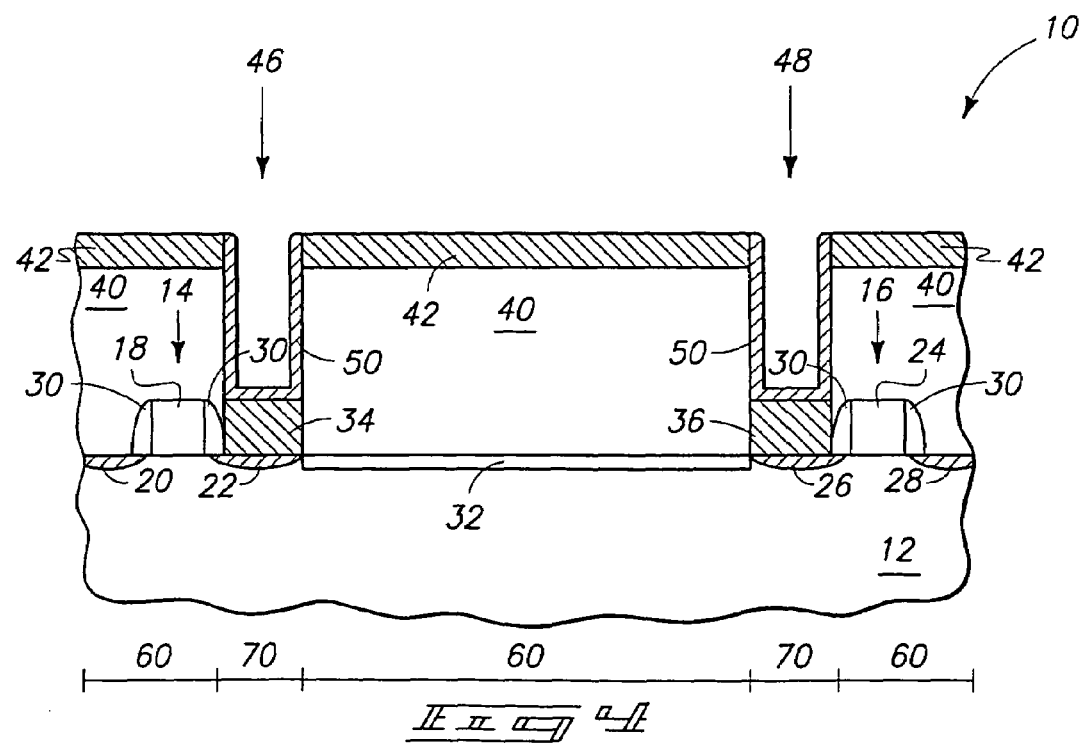

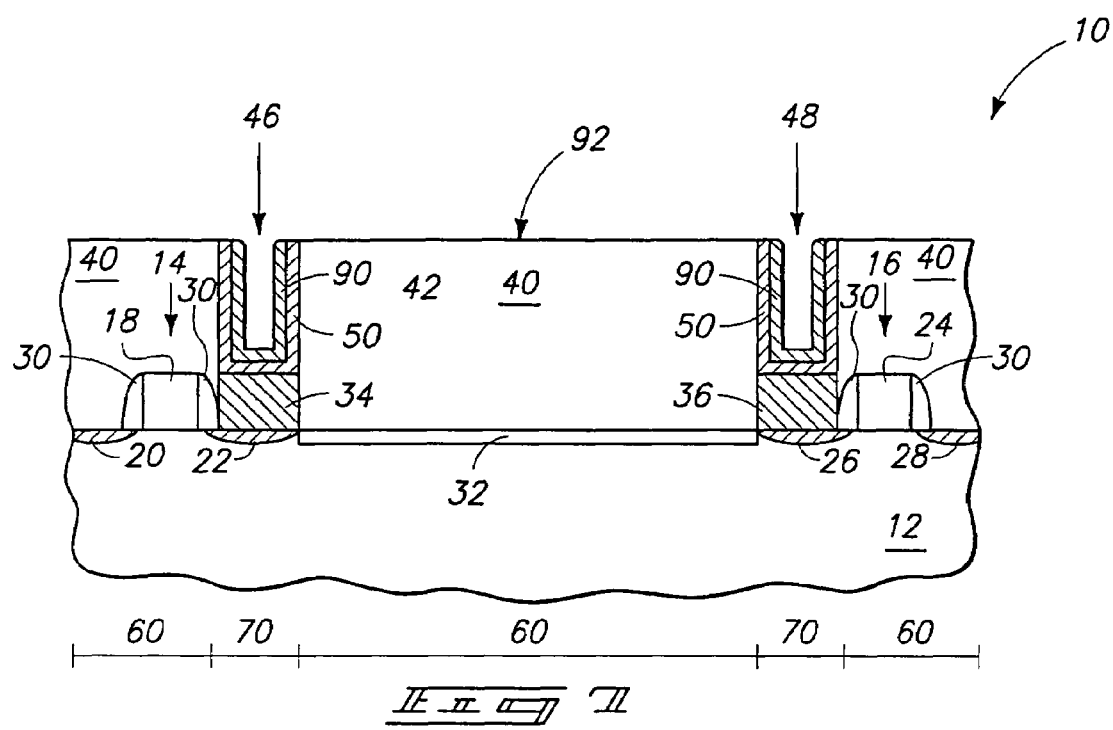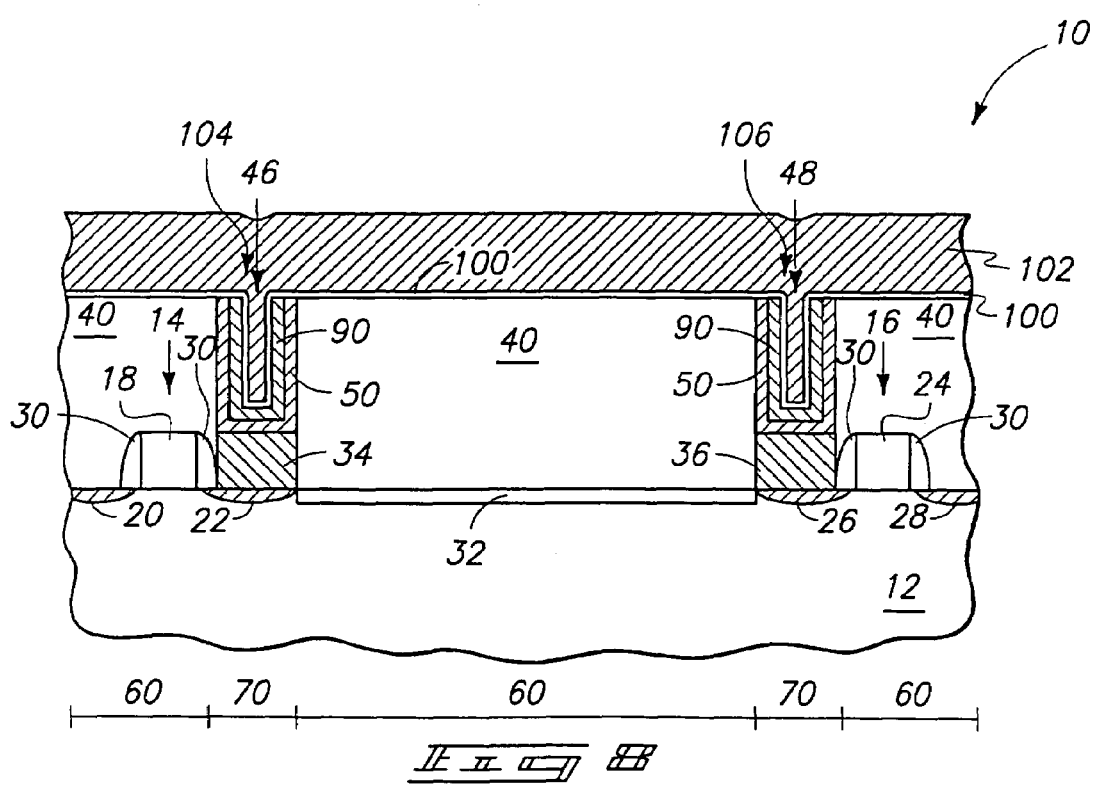

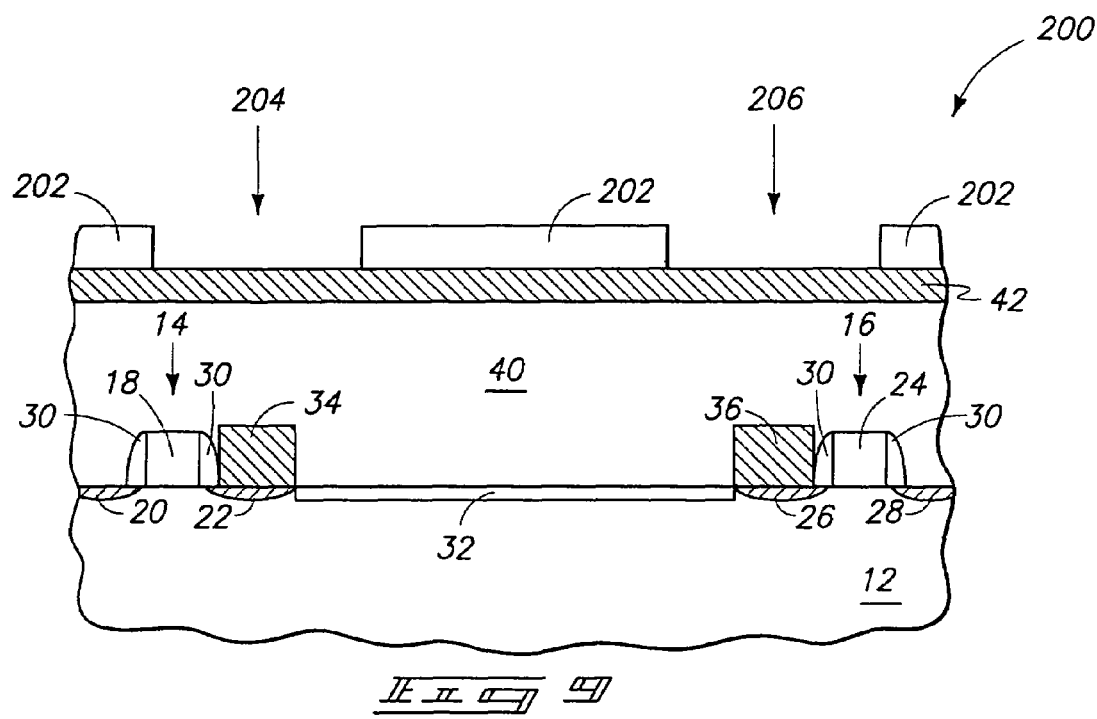
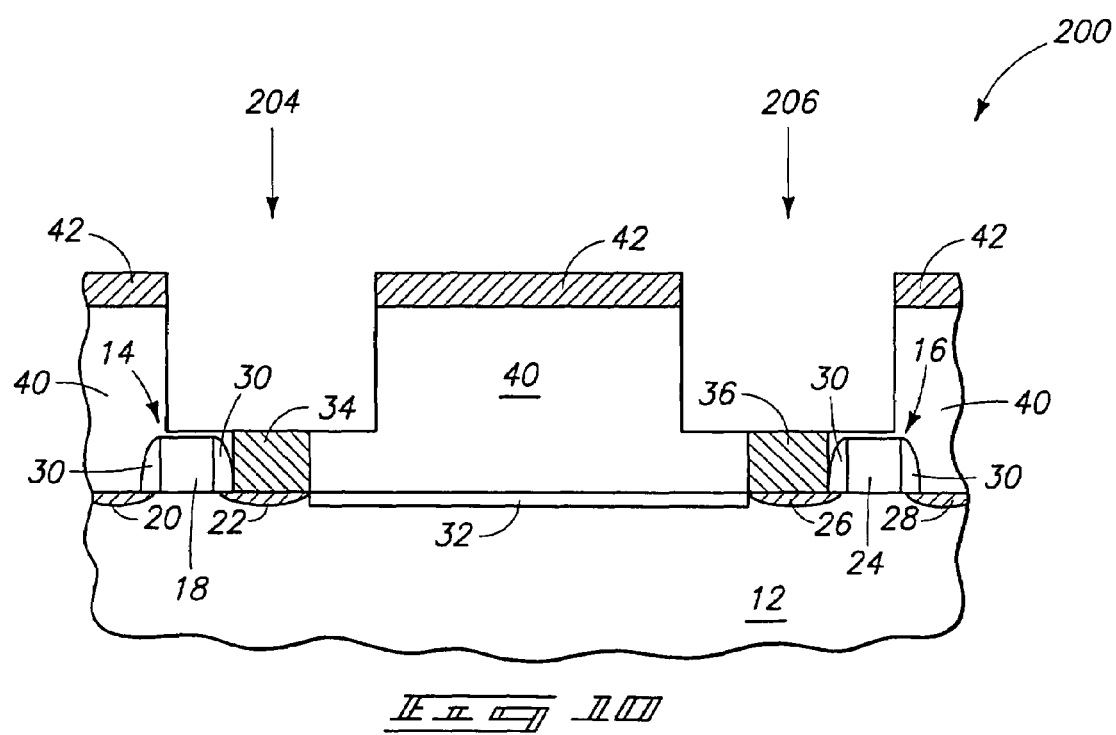

METHOD OF ELECTROPLATING A SUBSTANCE OVER A SEMICONDUCTOR SUBSTRATE

RELATED PATENT DATA

This patent resulted from a divisional application of U.S. patent application Ser. No. 10/199,736, which was filed Jul. 18, 2002 now U.S. Pat. No 6,984,301.

TECHNICAL FIELD

The invention pertains to methods of electrochemically treating semiconductor substrates. The invention includes methods of electroplating materials relative to semiconductor constructions, and in particular aspects pertains to methods of electroplating platinum and other noble metals associated semiconductor constructions. The invention also pertains to methods of forming capacitor constructions.

BACKGROUND OF THE INVENTION

Capacitors are utilized in numerous semiconductor constructions, including, for example, dynamic random access memory (DRAM) devices. Capacitors comprise a pair of electrically conductive materials (frequently referred to as a storage node and a capacitor plate) which are separated from one another by dielectric material. The conductive materials are thus capacitively coupled with one another.

Various materials have been utilized for the conductive components of capacitor constructions, including, for example, metals, metal silicides, metal nitrides and conductively-doped semiconductor materials (such as, for example, conductively-doped silicon). Materials that can be particularly useful in capacitor constructions are so-called noble metals, which include, for example, platinum, rhodium, iridium and ruthenium. A difficulty in utilizing the noble metals is in patterning constructions from the metals. For instance, if platinum is utilized to form a conductive component of a capacitor construction, it can be difficult to pattern the platinum into a desired shape.

One of the methods that is frequently utilized for patterning platinum is chemical-mechanical polishing. However, such method can smear platinum. The smearing can cause undesirable defect structures.

It would be desirable to develop new methods of forming noble metals into desired shapes for semiconductor applications, and it would be particularly desirable if such new methods could be applied to fabrication of capacitor structures.

Although the invention was motivated by the applications discussed above, it is to be understood that the invention is not limited to such applications except to the extent that the applications are explicitly recited in the claims which follow.

SUMMARY OF THE INVENTION

The invention includes methods of electrochemically treating semiconductor substrates. In one aspect, the invention encompasses a method of electroplating a substance over a semiconductor substrate. A substrate having defined first and second regions is provided. The first and second regions can be defined by a common mask, and accordingly can be considered to be self-aligned relative to one another. A first electrically conductive material is formed over the first region of the substrate, and a second electrically conductive material is formed over the second region. The first and second electrically conductive materials are exposed to an electrolytic solution while providing electrical current to the first and second electrically conductive materials. A desired substance is selectively electroplated onto the first electrically conductive material relative to the second electrically conductive material during the exposing of the first and second electrically conductive materials to the electrolytic solution.

In particular aspects, the invention encompasses methods of forming capacitor constructions.

BRIEF DESCRIPTION OF THE DRAWINGS

Preferred embodiments of the invention are described below with reference to the following accompanying drawings.

FIG. 3 is a view of the FIG. 1 wafer fragment shown at a processing stage subsequent to that of FIG. 2.

FIG. 4 is a view of the FIG. 1 wafer fragment shown at a processing stage subsequent to that of FIG. 3.

FIG. 7 is a view of the FIG. 1 wafer fragment shown at a processing stage subsequent to that of FIG. 6.

FIG. 8 is a view of the FIG. 1 wafer fragment shown at a processing stage subsequent to that of FIG. 7.

FIG. 9 is a view of a wafer fragment shown at an initial processing stage in accordance with further aspects of the present invention.

FIG. 10 is a view of the FIG. 9 wafer fragment shown at a processing stage subsequent to that of FIG. 9.

DETAILED DESCRIPTION OF THE PREFERRED EMBODIMENTS

Figure 1:
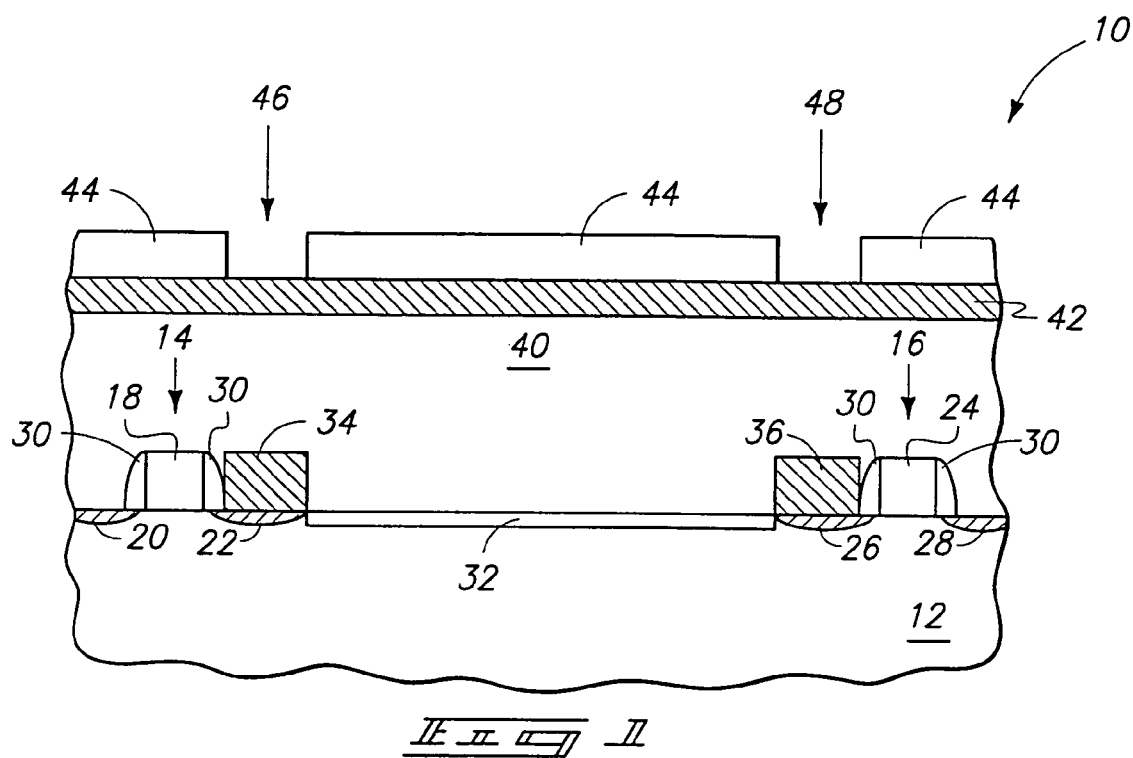
FIG. 1 is a diagrammatic, cross-sectional view of a semiconductor construction at a preliminary processing stage of an exemplary application of the present invention.

A first set of exemplary aspects of the invention are described with reference to FIGS. 1–8. Referring initially to FIG. 1, a fragment of a semiconductor construction 10 is illustrated. Construction 10 comprises a base 12. Base 12 can comprise, for example, a semiconductive material, such as, for example, monocrystalline silicon. Base 12 can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of transistor constructions 14 and 16 are supported by base 12. Construction 14 comprises a transistor gate 18, and a pair of source/drain regions 20 and 22. Construction 16 comprises a transistor gate 24, and a pair of source/drain regions 26 and 28. Transistor gates 18 and 24 can comprise, for example, patterned stacks which include gate oxide and one or more conductive layers. Source/drain regions 20, 22, 26 and 28 can correspond to either n-type or p-type doped regions within semiconductive material of base 12.

Sidewall spacers 30 extend along sidewalls of transistor gates 18 and 24. Sidewall spacers 30 can comprise, for example, one or both of silicon dioxide and silicon nitride.

An isolation region 32 extends between transistor constructions 14 and 16, and electrically isolates transistor constructions 14 and 16 from one another. Isolation region 32 can correspond to, for example, a shallow trench isolation region. Accordingly, isolation region 32 can correspond to a trench formed within semiconductor material of base 12 and filled with a suitable insulative material, such as, for example, silicon dioxide.

A pedestal 34 of electrically conductive material is formed over and in electrical contact with diffusion region 22, and another pedestal 36 of electrically conductive material is formed over and in electrical connection with diffusion region 26. The conductive material of pedestals 34 and 36 can comprise, for example, various metals and/or conductively-doped silicon. Pedestals 34 and 36 are optional, and the invention encompasses other aspects (not shown) in which pedestals 34 and 36 are omitted.

A mass 40 of electrically insulative material is formed over base 12, as well as over transistors 14 and 16, and pedestals 34 and 36. Mass 40 can comprise, consist essentially of, or consist of, for example, borophosphosilicate glass (BPSG).

An electrically conductive material 42 is formed over mass 40. Electrically conductive material 42 can comprise, consist essentially of, or consist of one or both of tantalum and tungsten. Electrically conductive material 42 will ultimately be utilized for carrying electrical potential across construction 10 during electrodeposition, and accordingly conductive material 42 is preferably provided over an entirety of an upper surface of the construction comprising the FIG. 1 fragment.

A patterned masking material 44 is formed over conductive material 42. Masking material 44 can comprise, for example, photoresist; and can be patterned utilizing photolithographic processing. Patterned masking material 44 has openings 46 and 48 extending therethrough.

Figure 2:
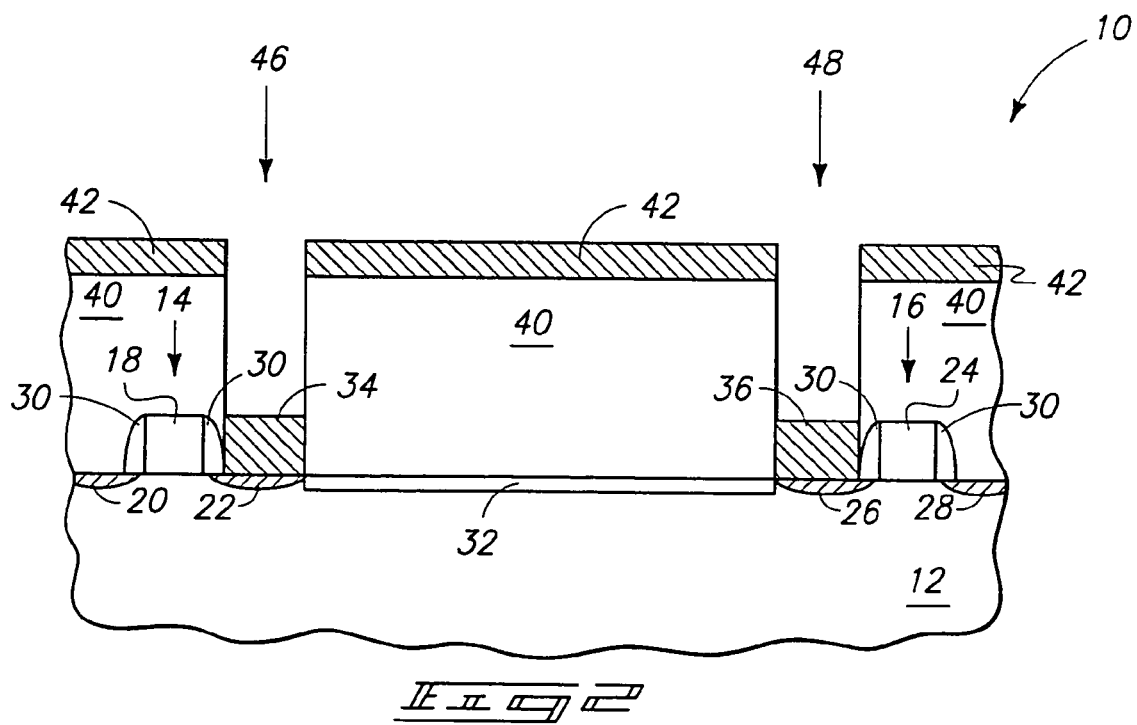
FIG. 2 is a view of the FIG. 1 wafer fragment shown at a processing stage subsequent to that of FIG. 1 in accordance with an exemplary aspect of the present invention.

Referring to FIG. 2, openings 46 and 48 are extended through electrically conductive material 42 and into electrically insulative mass 40. In the shown aspect of the invention, openings 46 and 48 are extended to upper surfaces of conductive pedestals 34 and 36, respectively. Openings 46 and 48 can be extended through conductive material 42 and insulative material 40 utilizing a suitable etch. After openings 46 and 48 are extended through conductive material 42, masking layer 44 (FIG. 1) is removed.

Referring to FIG. 3, an electrically conductive material 50 is formed over conductive material 42 and within openings 46 and 48. Electrically conductive material 50 only partially fills openings 46 and 48 in the shown aspect of the invention, and accordingly narrows the openings. Electrically conductive material 50 comprises a different composition than electrically conductive material 42; and can comprise, consist essentially of, or consist of, for example, one or more of copper, platinum, aluminum and tungsten. In the claims that follow, one of conductive materials 42 and 50 can be referred to as a first conductive material, and the other can be referred to as a second conductive material.

Conductive material 50 can be formed by, for example, sputter deposition. As another example, conductive material 50 can be formed by, for example, atomic layer deposition (ALD). For instance, material 50 can consist essentially of platinum, and can be formed utilizing ALD methodologies.

Referring to FIG. 4, conductive material 50 is removed from over conductive material 42, but left within openings 46 and 48. Such can be accomplished utilizing, for example, wet etching, dry etching, and/or chemical-mechanical polishing.

After removal of conductive material 50 from over conductive material 42, construction 10 can be considered to have two types of defined regions, 60 and 70, which differ from one another in the type of conductive material present at an upper surface of the construction. A first of the defined regions 60 has conductive material 42 at the upper surface, and a second of the defined regions 70 has conductive material 50 at the upper surface. In the shown construction, the second defined regions 70 extend within openings 46 and 48, and the first defined regions 60 do not extend within the openings. It is noted that the terminology of the first and second regions can be reversed. Accordingly, an alternative description of the construction 10 is that such comprises defined first regions 70 and second regions 60; with a first electrically conductive material 50 extending over the first regions of the semiconductor substrate and a second electrically conductive material 42 extending over the second regions 60 of the semiconductor substrate.

The processing stage of FIG. 4 can be considered to comprise a second electrically conductive material 50 formed within openings 46 and 48 but not over a first electrically conductive material 42. It is noted that the terminology of the first and second conductive materials can be utilized as a labeling method for distinguishing materials 42 and 50, rather than as an indication of an order of formation of materials 42 and 50. Accordingly, material 50 can be referred to as a first material and conductive material 42 referred to as a second conductive material in the claims which follow.

Figure 5:
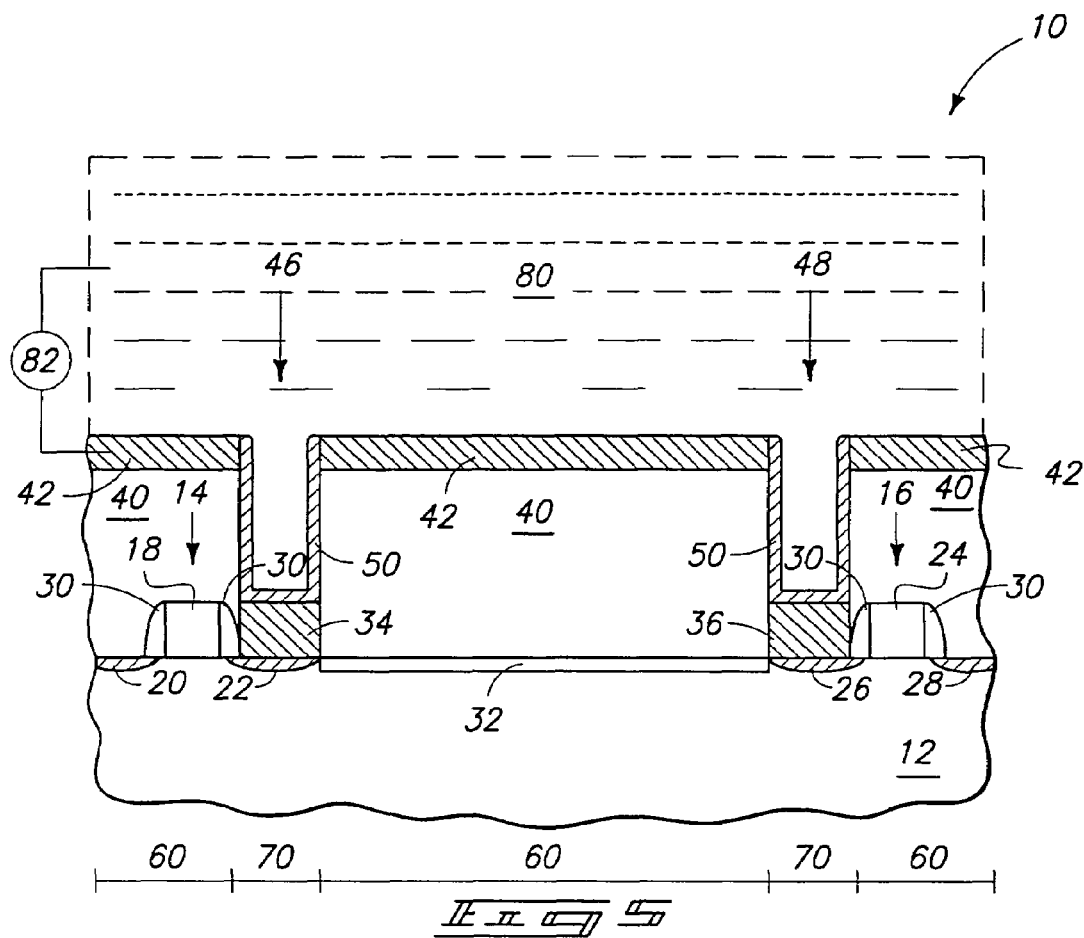
FIG. 5 is a view of the FIG. 1 wafer fragment shown at a processing stage subsequent to that of FIG. 4.

Referring to FIG. 5, electrically conductive materials 42 and 50 are exposed to an electrolytic solution 80. Such can be accomplished by submerging construction 10 within a vessel (not shown) containing the electrolytic solution. A power source 82 is provided, and electrically connected between material 42 and solution 80. Power source 82 is utilized to provide voltage (or current) and cause a substance to electrodeposit (or electroplate) from electrolytic solution 80 onto conductive material 50. It is noted that the substance may also deposit onto material 42. The electrodeposition is selective for conductive material 50 (at least initially) so that the electrodeposition onto material 50 is faster than electrodeposition onto material 42, to the extent that any electrodeposition on material 42 occurs. The electrodeposition can be referred to as selective electroplating of a substance from electrolytic solution 80 onto conductive material 50. If the electrodeposition occurs on both materials 50 and 42, the electrodeposited substance on material 50 is formed to be thicker than the substance on material 42 due to the primary electrodeposition of the substance on material 50 rather than material 42.

The substance electroplated onto material 50 can comprise, consist essentially of, or consist of one or more noble metals, such as, for example, platinum, rhodium, iridium and ruthenium. In particular aspects, the material can comprise one or more of platinum, rhodium, iridium, ruthenium, palladium, osmium and cobalt.

The electrolytic solution 80 can comprise, during the electroplating of a substance from solution 80 onto conductive material 50, a pH of from about 0.5 to about 12, a conductivity of from about 25 millisiemens to about 140 millisiemens, and a temperature of from about 20° C. to about 90° C. A pulse waveform of power can be applied from source 82 during the electroplating. The pulse waveform can enable a conformal coating of a substance to electroplate onto material 50 if sufficient rest time is provided between pulses to replenish a surface concentration of a depositing substance relative to a bulk concentration of the substance within solution 80. It can be preferred that a forward (negative potential) pulse of the waveform be sufficiently short to avoid depletion of a boundary layer and subsequent formation of concentration gradients from surfaces of the electroplating substance.

The substance which is ultimately to be electroplated from solution 80 onto conductive material 50 can be present as a salt within solution 80. For instance, if platinum is to be electroplated from solution 80 onto conductive material 50, the platinum can be initially present within solution 80 as one or more platinum salts.

The selectivity of the electrodeposition onto conductive material 50 relative to conductive material 42 can be accomplished through various mechanisms. For instance, materials 42 and 50 can be chosen such that material 42 requires a higher over-potential for electroplating of a substance thereon than does material 50. Such can be accomplished through the relative composition of material 42 to that of material 50. For instance, material 42 can be chosen to have poor nucleation, growth or adhesion of an electrodeposited substance relative to material 50. Alternatively, or additionally, selective electrodeposition on material 50 can be accomplished by providing a stable oxide or other protective layer (not shown) over material 42 to protect the material as the construction 10 is exposed to solution 80 (with the term "stable" indicating that the protective layer or oxide remains over material 42 during an entirety of the exposure to solution 80). The protective layer can alleviate, and even prevent, electrodeposition from occurring over conductive material 42. In some aspects the protective layer can be formed prior to exposing material 42 to solution 80, and in other aspects the protective layer can form as material 42 is exposed to solution 80.

In various aspects conductive material 50 can comprise, consist essentially of, or consist of tungsten; and conductive material 42 can comprise, consist essentially of, or consist of tantalum. In other aspects, conductive material 50 can comprise, consist essentially of, or consist of one or both of copper and platinum; and conductive material 42 can comprise, consist essentially of, or consist of tungsten. In yet other aspects, conductive material 50 can comprise, consist essentially of, or consist of one or more of copper, platinum and aluminum; and conductive material 42 can comprise, consist essentially of, or consist of tantalum.

In some aspects, conductive material 50 can comprise a composition which forms an oxide or other protective layer thereover prior to exposure to electrolytic solution 80. In such aspects, it can be desired to remove the protective layer from over conductive material 50 prior to the electrodeposition. If, for example, conductive material 50 comprises tungsten, and an oxide forms thereover, such oxide can be removed with hydrofluoric acid prior to exposing conductive material 50 to electrolytic solution 80. In another aspect, the oxide can be removed through redox processes occurring during exposure of the oxide to electrolytic solution 80.

Figure 6:
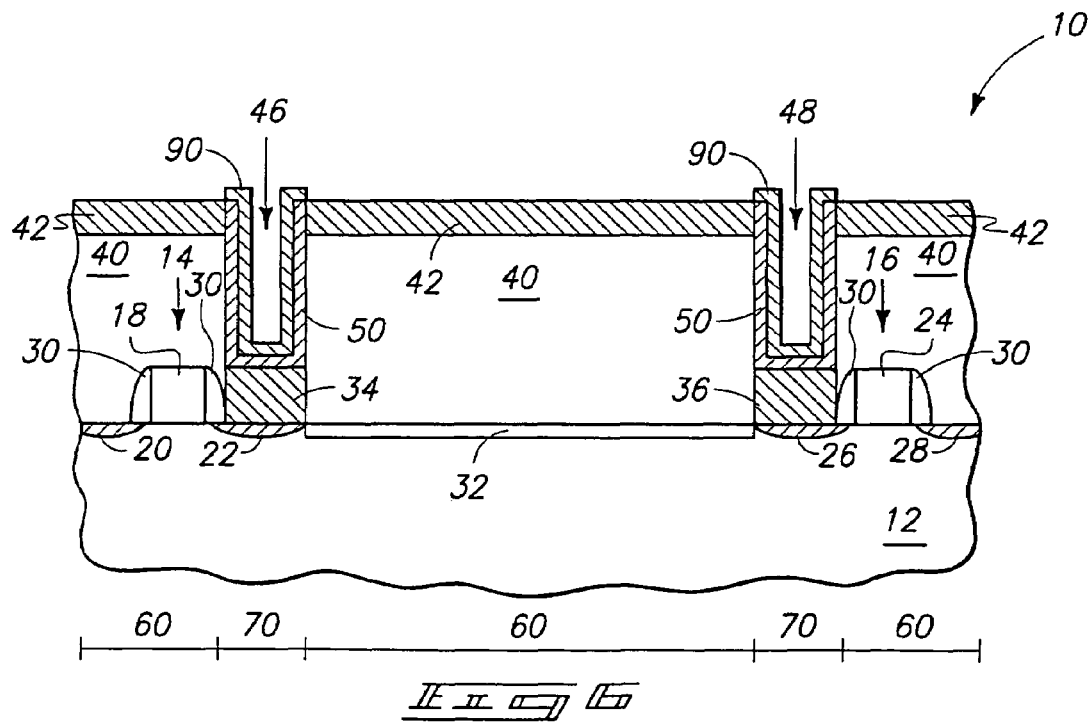
FIG. 6 is a view of the FIG. 1 wafer fragment shown at a processing stage subsequent to that of FIG. 5.

Referring to FIG. 6, construction 10 is illustrated after a substance 90 is selectively electroplated over conductive material 50 relative to conductive material 42. In the shown aspect of the invention, substance 90 is only on conductive material 50. Accordingly, there has been 100% selectivity for electroplating of substance 90 onto conductive material 50 relative to conductive material 42. It is to be understood, however, that the invention encompasses other aspects wherein the selectivity of electrodeposition for material 50 relative to material 42 is less than 100%.

As discussed previously, substance 90 can comprise, consist essentially of, or consist of one or more noble metals, such as, for example, one or more of platinum, rhodium, iridium and ruthenium. In some aspects, substance 90 can comprise, consist essentially of, or consist of one or more of platinum, rhodium, iridium, ruthenium, palladium, osmium, and cobalt.

Substance 90 can be, in particular aspects, considered a metal-containing layer which has been formed over selected regions 70 of a semiconductor substrate. It is noted that substance 90 can be considered to have been formed over selected region 70 of the substrate even if the selectivity for electrodeposition on material 50 relative to material 42 is less than 100%. The electroplating of substance 90 can allow the substance to be more conformally provided than it would be by other methods. The conformality of layer 90 can be enhanced if starting layer 50 is initially highly conformal, as can occur, for instance, if layer 50 is provided by an ALD process.

Referring to FIG. 7, electrically conductive material 42 (FIG. 6) is removed from over mass 40. Such removal can be accomplished by, for example, chemical-mechanical polishing. A protective material (not shown) can be formed within openings 46 and 48 during the chemical-mechanical polishing to preclude debris from falling into the openings. A suitable protective material can comprise photoresist. The photoresist can be removed after the chemical-mechanical polishing utilizing a suitable etch and/or ashing.

Chemical-mechanical polishing across an upper surface of construction 10 forms a planarized upper surface 92.

Referring to FIG. 8, a pair of layers 100 and 102 are formed over mass 40 and within openings 46 and 48. Layer 100 is a dielectric material, and layer 102 is an electrically conductive material. The dielectric material of layer 100 can comprise, consist essentially of, or consist of one or more of silicon dioxide, silicon nitride, tantalum pentoxide, and other dielectric materials known in the art to be suitable for utilization in capacitor constructions. The conductive material of layer 102 can comprise, for example, metal (such as platinum, copper and aluminum for example), metal alloys (such as copper/aluminum alloy), conductive compositions (such as metal silicides and/or conductively-doped silicon), and other conductive materials known to be suitable for incorporation into capacitor constructions. Substance 90 is separated from conductive layer 102 by dielectric material 100, and is capacitively coupled with the conductive material of layer 102. Accordingly, a pair of capacitor constructions 104 and 106 are formed from layers 50, 90, 100 and 102 in the shown construction.

The capacitor construction 104 can be connected with a bitline (not shown) through transistor 14, and accordingly can be incorporated into a DRAM array. Similarly, capacitor 106 can be connected with a bitline (not shown) through transistor 16, and can also be incorporated into the DRAM array. Capacitor 104 together with transistor construction 14 can be considered to comprise a DRAM cell, and similarly capacitor 106 together with transistor 16 can be considered to comprise a DRAM cell.

The regions 70 of FIG. 4 can be considered to be self-aligned relative to the regions 60, in that the regions were simultaneously defined by a common mask (mask 44 of FIG. 1). Further, the regions 70 can be considered to be aligned in both a two-dimensional sense relative to the regions 60, as well as in a three-dimensional sense (with the third dimension being the depth of the openings formed in regions 70). The processing of FIGS. 5–7 can be considered to selectively electroplate a material over one of the self-aligned regions relative to the other (with said one region being region 70 in the shown embodiment, and said other region being region 60). Although two types self-aligned regions are formed in the shown methods, it is to be understood that more than two types could be formed.

Although the shown embodiments of the present invention comprise selectively electroplating a material on one of two self-aligned regions relative to another, it is to be understood that the invention can be utilized for applications other than electroplating. For instance, the invention can be utilized for anodization to smooth surfaces, or for oxidation to form desired insulative material. Anodization could be accomplished with the processing of FIGS. 4 and 5 if materials 50 and 42 were exposed to an electrolytic solution under conditions which removed some of one or both of the materials 50 and 42. Such removal could smooth uneven surfaces of the materials, and effectively polish the materials. In particular aspects, one of the materials 50 and 42 could be selectively electropolished relative to the other. For instance, material 50 could be selectively polished relative to material 42. The electropolished material 50 could then be utilized for electroplating of material 90 (FIG. 6) thereon, and could subsequently be incorporated into a capacitor construction, such as the constructions shown in FIG. 8. The term "selectively polished" indicates that the rate of polishing of the first material is faster than the rate of polishing of the second material, and can include 100% selectivity (i.e., applications in which there is no polishing of the second material), or less than 100% selectivity. The conditions utilized for anodization typically comprise utilization of a electrolytic solution having either an acidic or basic pH and having one or more surfactants therein. An appropriate acidic pH can be formed by, for example, utilizing phosphoric acid or nitric acid in the electrolytic solution.

The invention can be utilized for oxidation of a material utilizing the processing of FIGS. 4 and 5. If conductive materials 50 and 42 are exposed to an electrolytic solution under conditions which oxidize one or both of the materials, the oxidization can convert the conductive material to an insulative material. The invention includes applications in which one of two self-aligned regions (for instance, region 70 of FIG. 4) comprises a conductive material (for instance, material 50 of FIG. 4) which is selectively oxidized relative to a conductive material (for instance, material 42 of FIG. 4) comprised by the other of the two self-aligned regions (for instance, region 60 of FIG. 4). The term "selectively oxidized" indicates that the rate of oxidation of the first material is faster than the rate of oxidation of the second material, and can include 100% selectivity (i.e., applications in which there is no oxidation of the second material), or less than 100% selectivity. In particular applications a dielectric material consisting of, or consisting essentially of crystalline $Ta_2O_5$ is formed from a first material comprising, consisting essentially of, or consisting of Ta and/or TaN by exposing the first material to electrochemical processing which converts the first material to the $Ta_2O_5$. The dielectric material can be incorporated into a capacitor construction.

FIGS. 9–14 illustrate additional aspects of the invention. In referring to FIGS. 9–14, similar numbering will be utilized as was used above in describing FIGS. 1–8, where appropriate.

Referring initially to FIG. 9, a fragment of a semiconductor construction 200 is illustrated. Construction 200 comprises the base 12 and capacitor constructions 14 and 16 described previously with reference to FIG. 1. Construction 200 also comprises the isolation region 32, and pedestals 34 and 36 described previously with reference to FIG. 1. Additionally, construction 200 comprises the mass 40 and electrically conductive material 42 described previously with reference to FIG. 1.

A masking material 202 is formed over the conductive material 42 of construction 200. Masking material 202 is patterned to have openings 204 and 206 extending therethrough. Masking material 202 can be similar to the masking material 44 described with reference to FIG. 1, but in the shown embodiment differs in that openings 204 and 206 are wider than the openings 46 and 48 of the FIG. 1 embodiment.

Referring to FIG. 10, openings 204 and 206 are extended through electrically conductive material 42 and into electrically insulative material 40. Subsequently, masking material 202 (FIG. 10) is removed. Openings 204 and 206 are extended into mass 40 to about an elevational level of uppermost surfaces of pedestals 34 and 36. Accordingly, uppermost surfaces of pedestals 34 and 36 are exposed at bottom peripheries of openings 204 and 206, respectively. In particular aspects of the invention, pedestals 34 and 36 can both comprise platinum, and accordingly openings 204 and 206 can be extended downwardly into mass 40 to an elevational level at which platinum of pedestals 34 and 36 is exposed within the openings.

Figure 11:
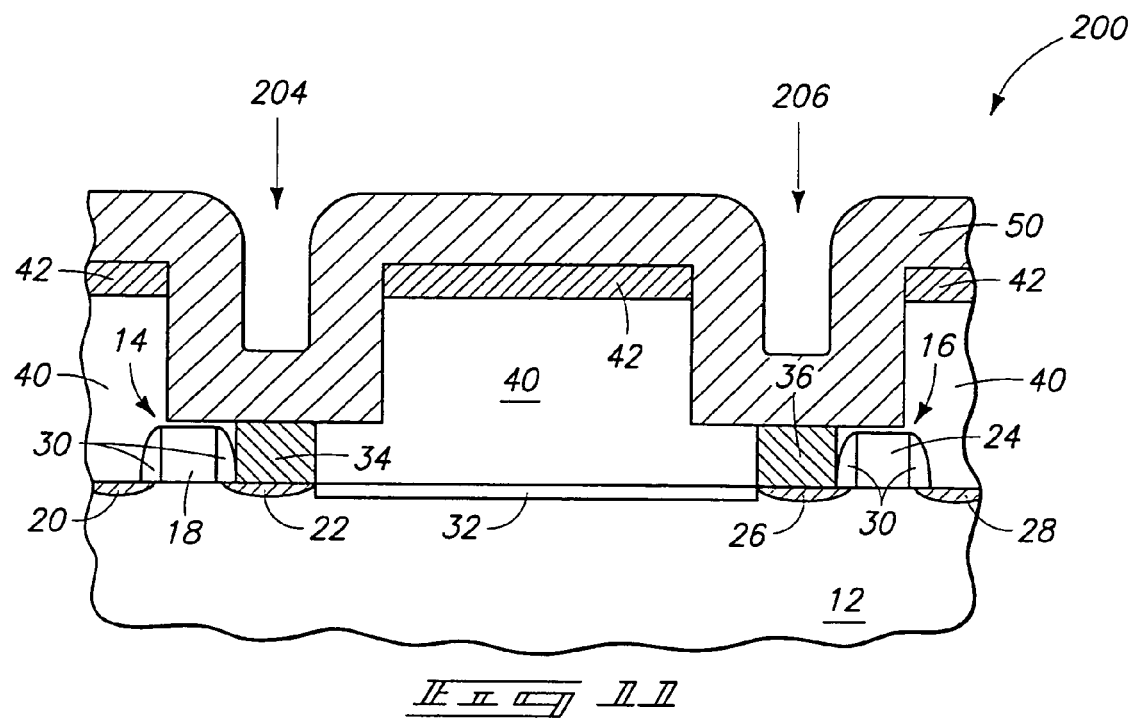
FIG. 11 is a view of the FIG. 9 wafer fragment shown at a processing stage subsequent to that of FIG. 10.

Referring to FIG. 11, electrically conductive mass 50 is formed within openings 204 and 206 and across an upper surface of electrically conductive material 42. The construction of FIG. 11 is similar to the construction 10 described above with reference to FIG. 3, but differs in that openings 204 and 206 are wider than the openings 46 and 48 shown in FIG. 3, and also in that conductive material 50 of FIG. 11 is shown to be substantially thicker than the thickness shown in the FIG. 3 construction.

Figure 12:
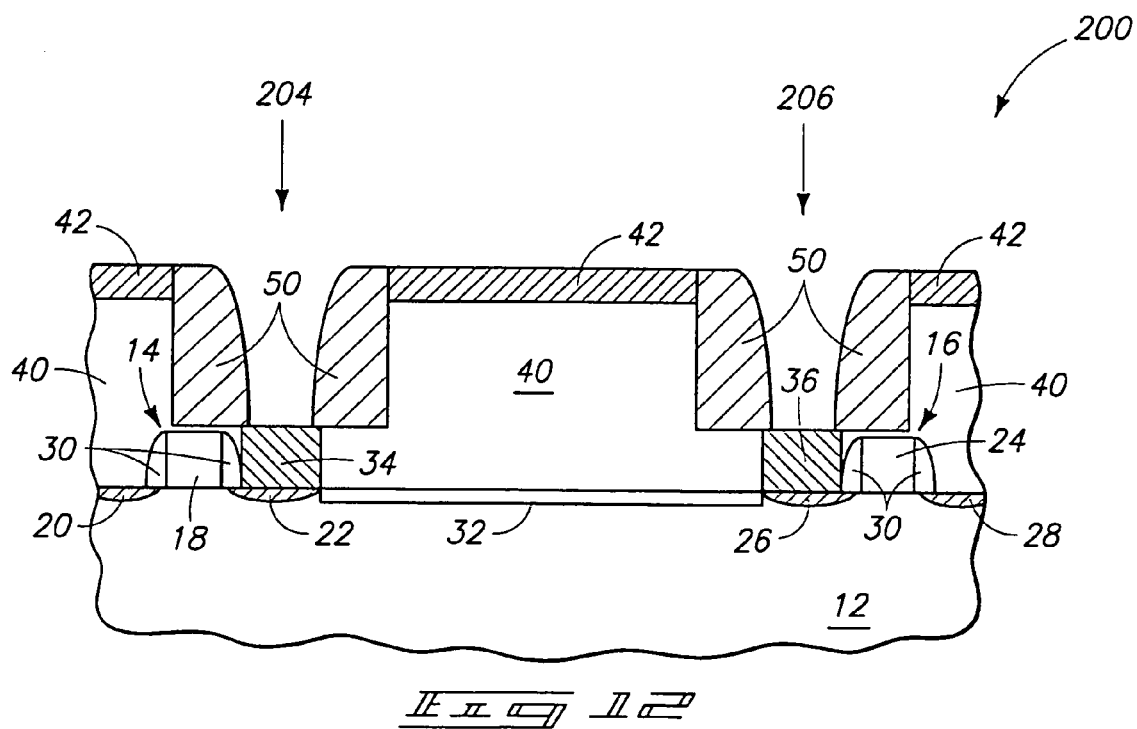
FIG. 12 is a view of the FIG. 9 wafer fragment shown at a processing stage subsequent to that of FIG. 11.

Referring to FIG. 12, material 50 is subjected to an anisotropic (or in other words directional) etch. Such forms material 50 into the shown spacer constructions. In subsequent processing (described below) material 50 will be removed, and accordingly the spacers can be considered to be sacrificial spacers.

The construction 200 of FIG. 12 can be considered to have 3 types of exposed conductive surfaces. Specifically, one type of exposed electrically conductive surface is an uppermost surface of conductive material 42, a second type of exposed electrically conductive surface are the upper surfaces of conductor material 50, and a third type of exposed conductive surface corresponds to the upper surfaces of pedestals 34 and 36. The three types of electrically conductive surfaces can all be different from one another, or in particular embodiments two of the three types of surfaces can be identical in composition to one another. For instance, the material 50 can be identical in composition to the pedestals 34 and 36. In an exemplary embodiment, material 50 and pedestals 34 and 36 can all comprise platinum. In other exemplary embodiments, material 50 can be identical in composition to material 42, and different from the material of pedestals 34 and 36. For instance, pedestals 34 and 36 can each consist essentially of Pt and/or Rh, and materials 50 and 42 can both consist essentially of tungsten.

In particular embodiments, materials 42 and 50 will differ from the material of pedestals 34 and 36. In such embodiments, the construction 200 of FIG. 12 can be subjected to electrolytic processing similar to that described above with reference to FIG. 4 to selectively electroplate a substance on material pedestals 34 and 36, relative to materials 42 and 50. Accordingly, the substance can be selectively electroplated within openings 204 and 206. During such electroplating, conductive materials 42, 50 and 34 preferably together form a continuous conductive surface (i.e., conductive bridge) extending across the wafer comprising fragment 200. The conductive surface is connected to a power source external of the wafer through conductive material 42, analogously to the construction described above with reference to FIG. 5.

Figure 13:
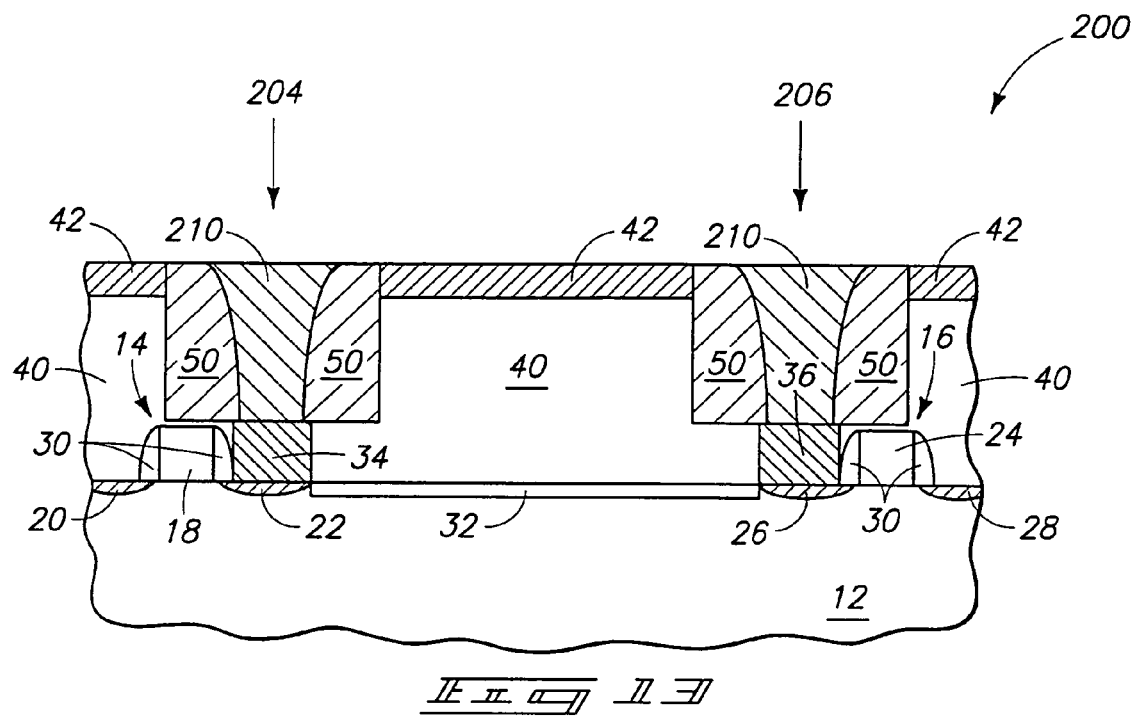
FIG. 13 is a view of the FIG. 9 wafer fragment shown at a processing stage subsequent to that of FIG. 12.

FIG. 13 illustrates construction 200 after a substance 210 is selectively electroplated within openings 204 and 206 (with the openings 204 and 206 being shown in FIG. 12). Substance 210 can comprise the various compositions described above with reference to the substance 90 shown in FIG. 6. For instance, substance 210 can comprise, consist essentially of, or consist of one or more noble metals, such as, for example, platinum, rhodium, iridium and ruthenium.

Figure 14:
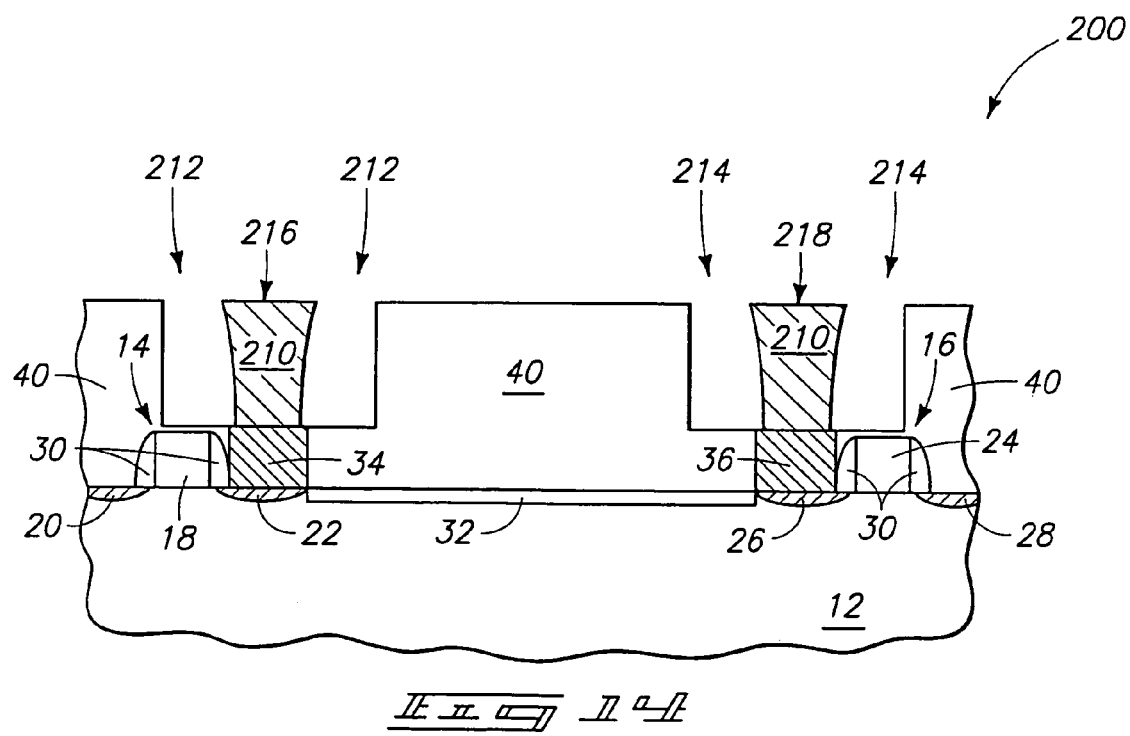
FIG. 14 is a view of the FIG. 9 wafer fragment shown at a processing stage subsequent to that of FIG. 13.

Referring to FIG. 14, materials 50 and 42 are selectively removed relative to the substance 210. Such can be accomplished with suitable wet and/or dry etches, and can be simplified if materials 50 and 42 comprise the same composition as one another. In the shown aspect of the invention, materials 50 and 42 are also selectively removed relative to mass 40. Accordingly, openings 212 and 214 are formed around pedestals 216 and 218 defined by substance 210. In the cross-sectional view of FIG. 14 it appears that openings 212 are actually a pair of openings separated by pedestal 216, and similarly that openings 214 are a pair of openings separated by a pedestal 218. It is to be understood, however, that pedestals 216 and 218 would typically each comprise a continuous outer periphery when viewed from above (with the outer peripheries being circular in exemplary constructions), and the openings 212 and 214 would extend continuously around such outer peripheries.

Figure 15:
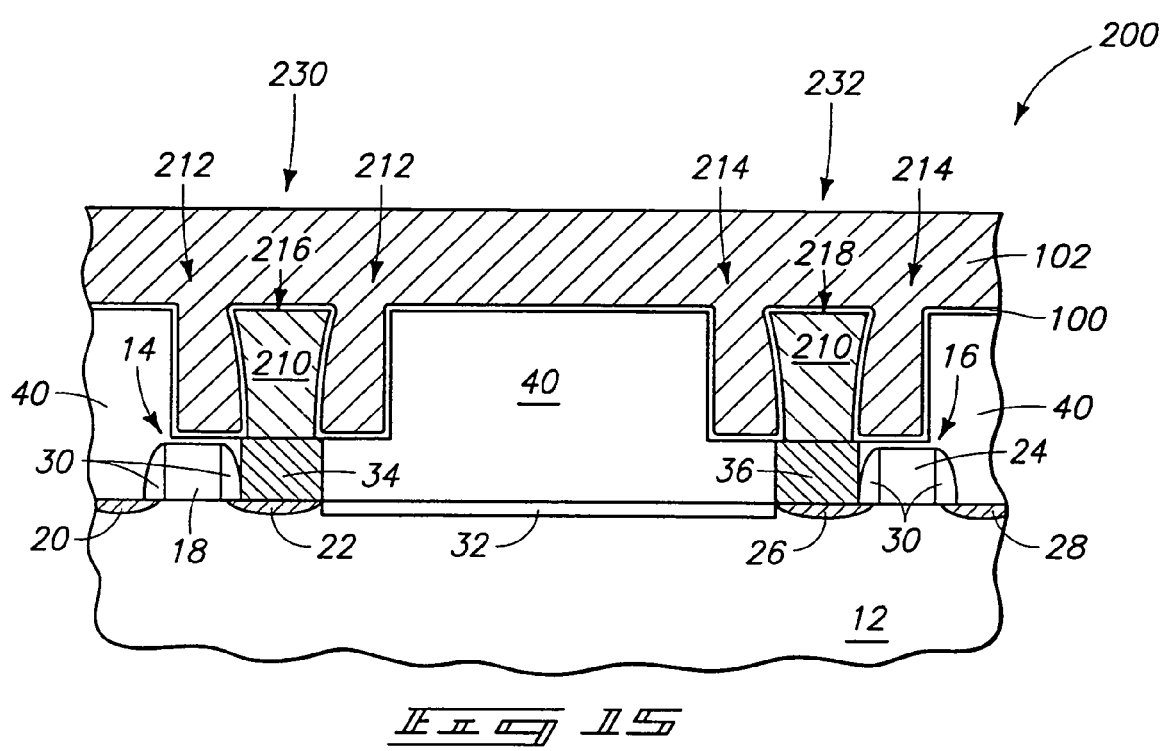
FIG. 15 is a view of the FIG. 9 wafer fragment shown at a processing stage subsequent to that of FIG. 14.

Referring to FIG. 15, a dielectric material 100 and capacitor plate 102 are formed over pedestals 216 and 218, and within the openings 212 and 214. A pair of capacitor constructions 230 and 232 can be considered to comprise pedestals 216 and 218, respectively, together with dielectric material 100 and capacitor electrode material 102. Capacitor constructions 230 and 232 can be considered to be "stud" type capacitor constructions.

Although the invention is described primarily with reference to methods of forming capacitor constructions, it is to be understood that the invention can be utilized in other applications.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of electroplating a substance over a semiconductor substrate, comprising:

forming a first electrically conductive material over a first region of the semiconductor substrate and forming a second electrically conductive material over a second region of the semiconductor substrate;

flowing an electrical current through the first and second electrically conductive materials while exposing the first and second electrically conductive materials to an electrolytic solution; and electroplating a substance onto the first electrically conductive material during the flowing of the electrical current through the first and second electrically conductive materials and while exposing both of the first and second electrically conductive materials to the electrolytic solution; the substance being formed primarily on the first of the electrically conductive materials such that the substance is thicker on the first electrically conductive material relative to any of the substance on the second electrically conductive material.

2. The method of claim 1 wherein the substance is electroplated only on the first electrically conductive material.

3. The method of claim 1 wherein the substance is electroplated on both of the first and second electrically conductive materials.

4. The method of claim 1 wherein the electrolytic solution comprises, during the electroplating, a pH of from about 0.5 to about 12; a conductivity of from about 25 millisiemens to about 140 millisiemens; and a temperature of from about 2° C. to about 90° C.

5. The method of claim 1 wherein the first electrically conductive material comprises tungsten and the second electrically conductive material comprises tantalum.

6. The method of claim 1 wherein the first electrically conductive material consists essentially of tungsten and the second electrically conductive material consists essentially of tantalum.

7. The method of claim 1 wherein the first electrically conductive material comprises copper and the second electrically conductive material comprises tantalum.

8. The method of claim 1 wherein the first electrically conductive material consists essentially of copper and the second electrically conductive material consists essentially of tantalum.

9. The method of claim 1 wherein the first electrically conductive material comprises copper and the second electrically conductive material comprises tungsten.

10. The method of claim 1 wherein the first electrically conductive material consists essentially of copper and the second electrically conductive material consists essentially of tungsten.

11. The method of claim 1 wherein the first electrically conductive material comprises platinum and the second electrically conductive material comprises tantalum.

12. The method of claim 1 wherein the first electrically conductive material consists essentially of platinum and the second electrically conductive material consists essentially of tantalum.

13. The method of claim 1 wherein the first electrically conductive material comprises platinum and the second electrically conductive material comprises tungsten.

14. The method of claim 1 wherein the first electrically conductive material consists essentially of platinum and the second electrically conductive material consists essentially of tungsten.

15. The method of claim 1 wherein the first electrically conductive material comprises aluminum and the second electrically conductive material comprises tantalum.

16. The method of claim 1 wherein the first electrically conductive material consists essentially of aluminum and the second electrically conductive material consists essentially of tantalum.

17. The method of claim 1 wherein the substance comprises platinum.

18. The method of claim 1 wherein the substance consists essentially of platinum.

* * * * *

UNITED STATES PATENT AND TRADEMARK OFFICE
CERTIFICATE OF CORRECTION

PATENT NO. : 7,273,778 B2  Page 1 of 1
APPLICATION NO. : 11/053781
DATED : September 25, 2007
INVENTOR(S) : Collins et al.

It is certified that error appears in the above-identified patent and that said Letters Patent is hereby corrected as shown below:

In column 10, line 33, in Claim 4, delete "2°" and insert -- 20° --, therefor.

Signed and Sealed this

Twenty-seventh Day of November, 2007

JON W. DUDAS
*Director of the United States Patent and Trademark Office*